(12) United States Patent
Kuroki

(10) Patent No.: US 11,137,712 B2
(45) Date of Patent: Oct. 5, 2021

(54) IMAGE FORMING APPARATUS INCLUDING VARISTOR

(71) Applicant: CANON KABUSHIKI KAISHA, Tokyo (JP)

(72) Inventor: Tooru Kuroki, Tsukuba (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/925,525

(22) Filed: Jul. 10, 2020

(65) Prior Publication Data

US 2021/0018871 A1 Jan. 21, 2021

(30) Foreign Application Priority Data

Jul. 19, 2019 (JP) .............................. JP2019-133394

(51) Int. Cl.
| | |
|---|---|
| *G03G 15/00* | (2006.01) |
| *H05K 1/00* | (2006.01) |
| *G03G 21/20* | (2006.01) |
| *H05K 1/02* | (2006.01) |
| *G03G 15/20* | (2006.01) |

(52) U.S. Cl.
CPC .......... *G03G 15/80* (2013.01); *G03G 21/206* (2013.01); *H05K 1/021* (2013.01); *H05K 1/0203* (2013.01); *G03G 15/2017* (2013.01); *G03G 2215/00632* (2013.01)

(58) Field of Classification Search
CPC ...... G03G 15/80; G03G 21/206; H05K 1/181; H05K 1/021; H05K 1/0204; H05K 1/0203
USPC .............................................. 399/88, 90, 92
See application file for complete search history.

(56) References Cited

U.S. PATENT DOCUMENTS

| | | | | |
|---|---|---|---|---|
| 4,299,474 A | * | 11/1981 | Ernst .................... | G03G 15/307 355/110 |
| 7,286,361 B2 | * | 10/2007 | Yamanaka ............ | H01L 23/367 165/185 |
| 7,580,264 B2 | * | 8/2009 | Tanimoto ............ | H01L 23/3672 165/185 |

(Continued)

FOREIGN PATENT DOCUMENTS

| | | |
|---|---|---|
| JP | 2008-198969 | 8/2008 |
| JP | 2014046595 A * | 3/2014 |

OTHER PUBLICATIONS

U.S. Appl. No. 16/896,449, filed Jun. 9, 2020 by Tooru Kuroki.

*Primary Examiner* — Robert B Beatty
(74) *Attorney, Agent, or Firm* — Venable LLP

(57) ABSTRACT

An image forming apparatus including: a circuit board including a varistor, an electric part different from the varistor, and a heatsink for the electric part, the circuit board being supplied with a voltage from a commercial power source; a fan configured to cool the circuit board; and a housing configured to house the circuit board, wherein an opening is formed in the housing, wherein a cross-section shape of the heatsink is a U-shape, the varistor is positioned between a first wall portion and a second wall portion of the heatsink so that the heatsink straddles the varistor, and a position of the heatsink in a direction orthogonal to a longitudinal direction of the heatsink overlaps with a position of the opening in the direction so that an air is caused to flow between the first wall portion and the second wall portion through the opening by the fan.

9 Claims, 7 Drawing Sheets

(56) References Cited

U.S. PATENT DOCUMENTS

| | | | | |
|---|---|---|---|---|
| 2004/0096229 | A1* | 5/2004 | Yoshihara | G03G 15/2039 |
| | | | | 399/33 |
| 2007/0247811 | A1* | 10/2007 | Ohmi | H05K 7/20909 |
| | | | | 361/697 |
| 2010/0124018 | A1* | 5/2010 | Yoshida | G03G 21/206 |
| | | | | 361/695 |
| 2018/0035530 | A1* | 2/2018 | Moribayashi | H05K 7/20445 |
| 2019/0307013 | A1* | 10/2019 | Hashizume | H05K 7/1422 |
| 2019/0369554 | A1* | 12/2019 | Sawada | G03G 21/206 |
| 2020/0103805 | A1* | 4/2020 | Suzuki | G03G 15/20 |

* cited by examiner

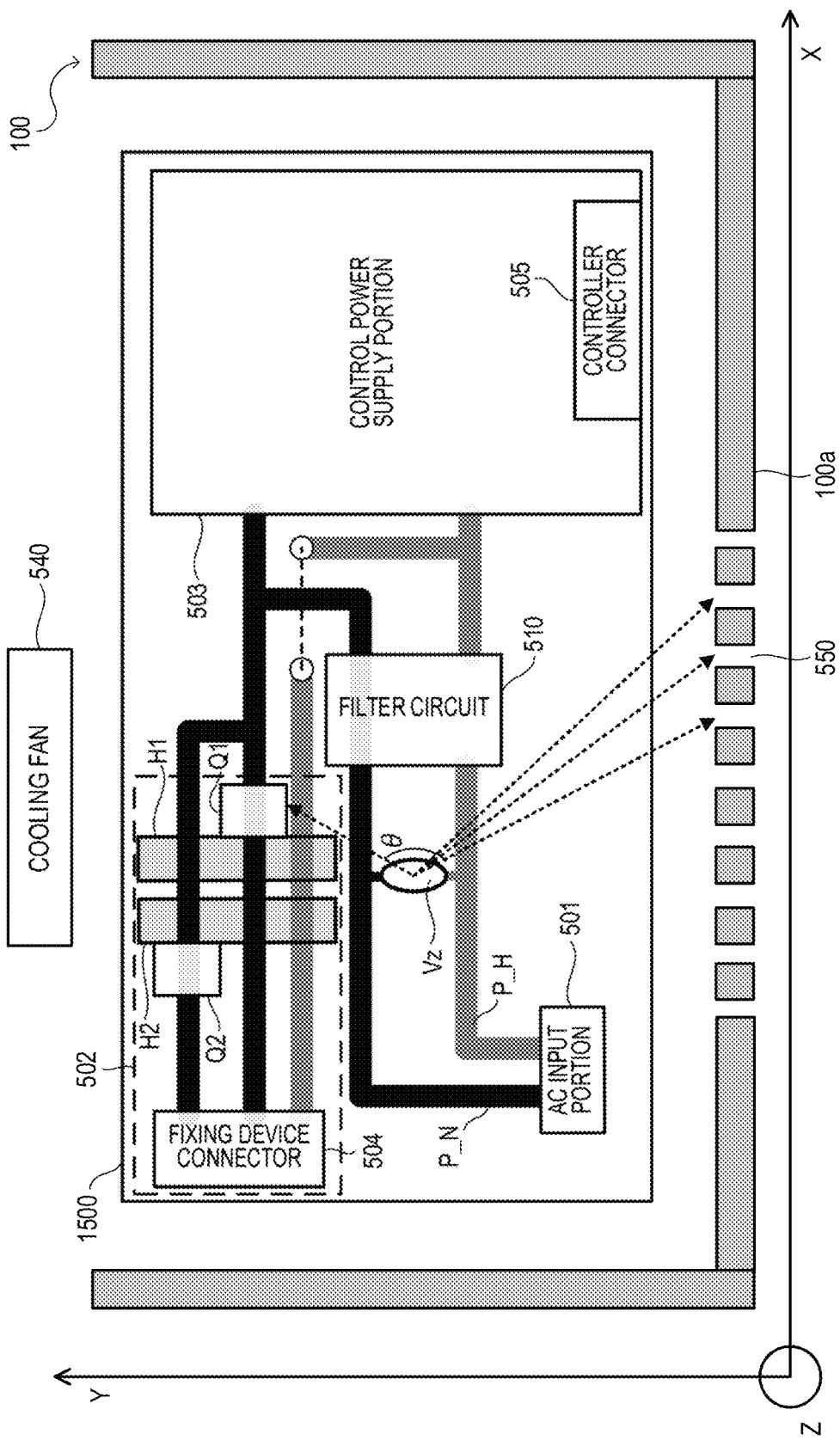

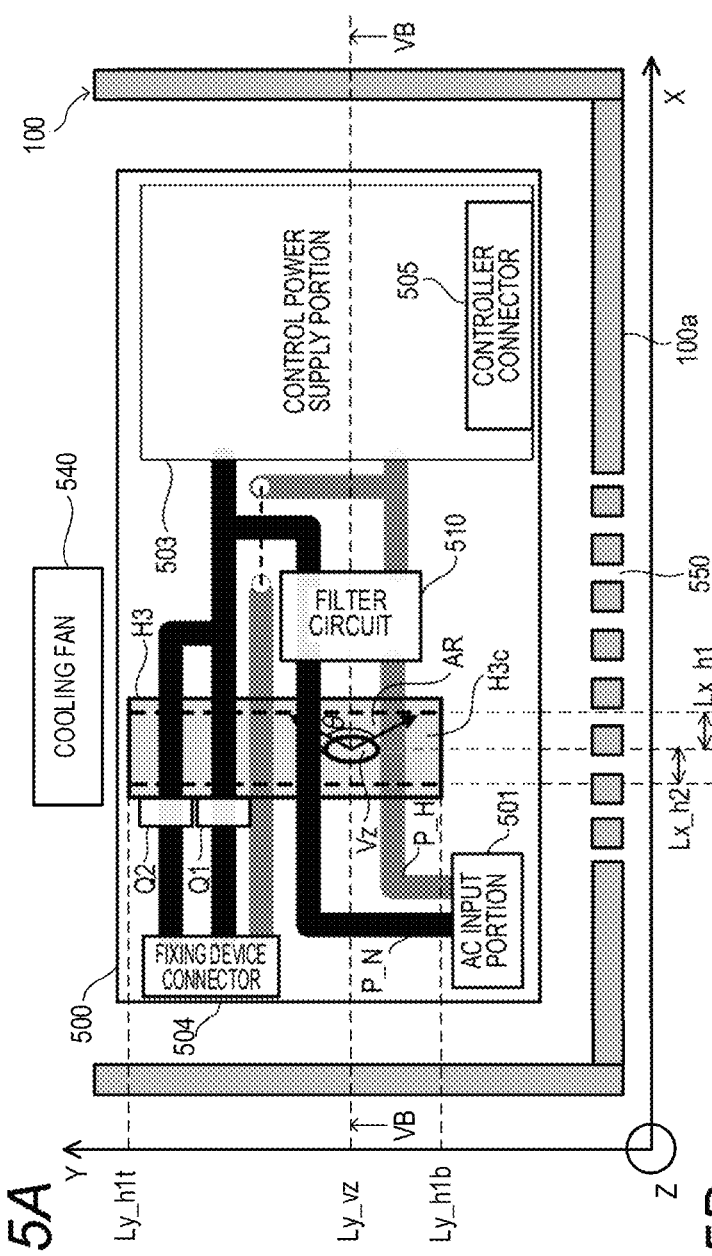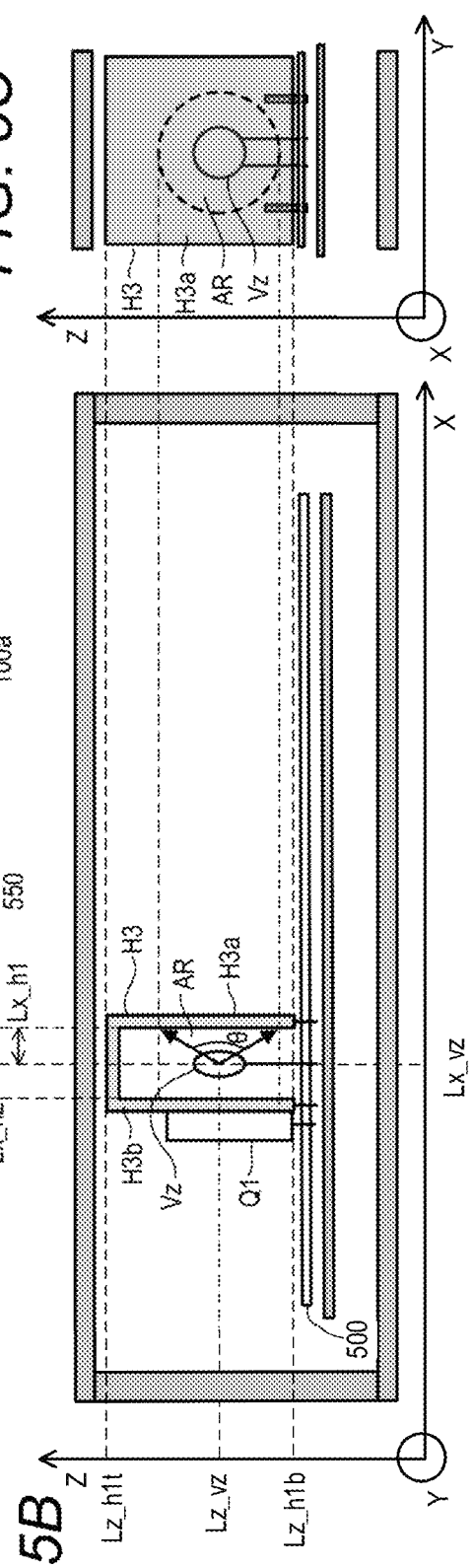

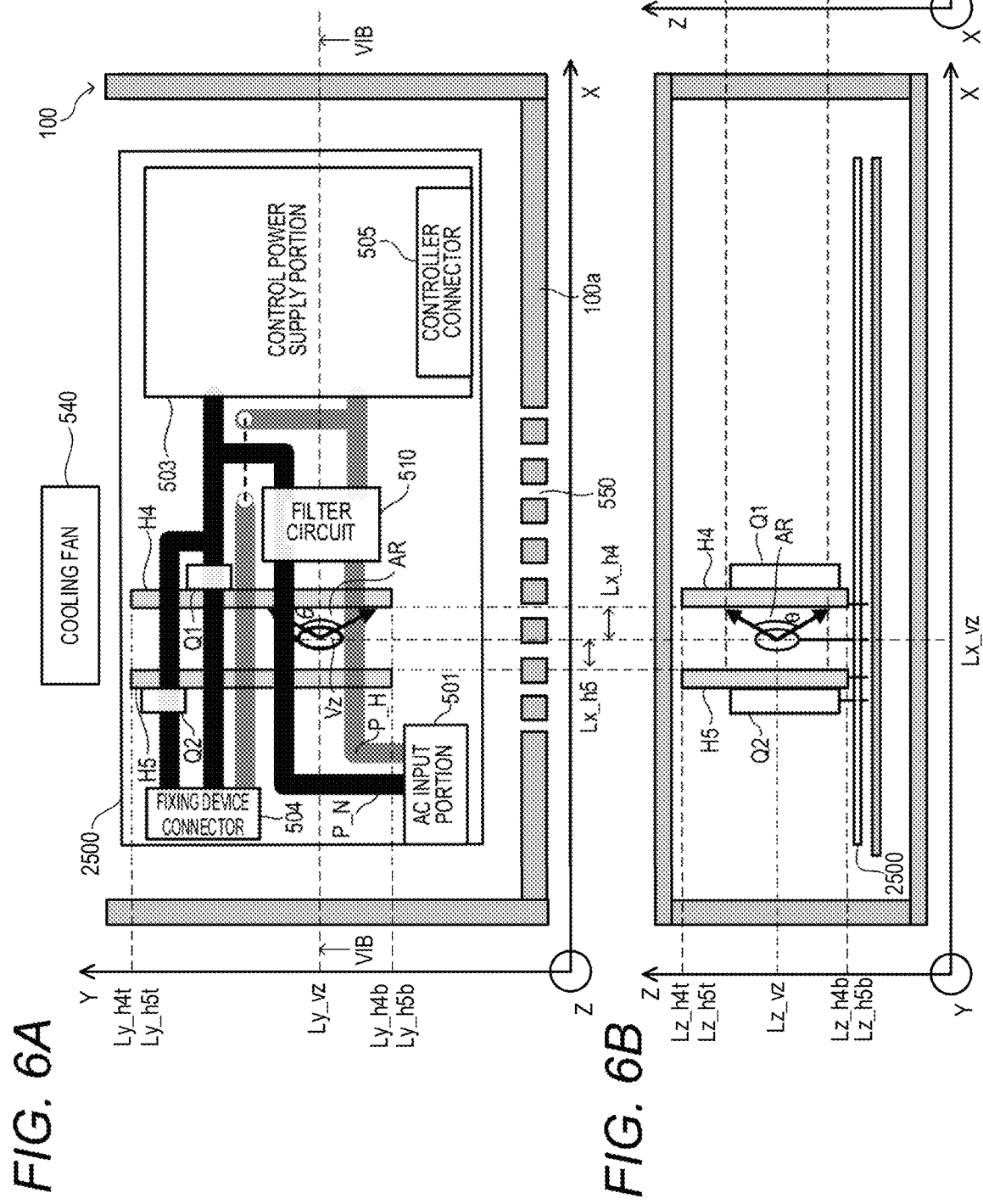

IMAGE FORMING APPARATUS INCLUDING VARISTOR

BACKGROUND OF THE INVENTION

Field of the Invention

The present invention relates to an image forming apparatus including a circuit board including a varistor.

Description of the Related Art

On a power supply circuit board for, for example, a low-pressure power source for an image forming apparatus, an electric part having a surge absorption characteristic, as represented by a varistor, is provided for the purpose of protecting a circuit on the circuit board from a high voltage current (surge current). In such a rare case that an abnormal voltage is repeatedly applied, the above-mentioned electric part provided for the purpose of surge absorption may gradually be degraded to cause a failure accompanied by scattering of the part. It is extremely rare that the degradation of the electric part progresses to the worst level at which the failure accompanied by the scattering of the part may occur. However, the scattering of the part is required to be assumed. Meanwhile, heat-generating parts are concentrated around the power supply circuit board to be used for the image forming apparatus, and thus an opening portion for cooling (louver) is formed in many cases. That is, the opening portion for cooling and the varistor are often provided adjacent to each other, and hence fragments of the broken electric part are required to be reliably prevented from being scattered via an air path to the outside of the image forming apparatus through the opening portion.

Technologies for preventing the scattering of the fragments of the broken electric part via the air path to the outside of the image forming apparatus through the opening portion are roughly classified into two types. One of the types of technologies involves a method of increasing a distance between the varistor and the opening portion. Another one of the types involves a method of directly preventing the scattering of the fragments of the varistor to the outside. As the latter related-art technology, there is disclosed in Japanese Patent Application Laid-Open No. 2008-198969 that the varistor is covered with a metal case having one open surface. As another method of the latter related-art technology, there is a method using a louver having a sightproof structure or a louver having small holes. FIG. 7 is a sectional view of a related-art image forming apparatus 1100 configured to prevent the scattering of the fragments of the varistor. The related-art image forming apparatus 1100 includes a power supply circuit board 3500, an air intake louver 111, a cooling fan 113, and an air exhaust louver 112. A varistor is mounted on the power supply circuit board 3500. The air intake louver 111, which corresponds to an air-intake opening portion, has a sightproof structure with complicated air passage routes. The air exhaust louver 112, which corresponds to an air-exhaust opening portion, has small holes. The air intake louver 111 having the sightproof structure and the air exhaust louver 112 having the small holes prevent the scattering of the fragments of the varistor to the outside of the image forming apparatus 1100.

With the method of increasing the distance between the varistor and the opening portion, however, a position at which the varistor may be mounted is restricted, which may lead to an increase in size of the image forming apparatus.

As disclosed in Japanese Patent Application Laid-Open No. 2008-198969, even when an element is covered with the metal case, an area exclusively occupied by the varistor on the power supply circuit board is increased by an area of the metal case. Thus, a size of the power supply circuit board itself is increased to hinder downsizing of the image forming apparatus. Further, when the air intake louver 111 having the sightproof structure and the air exhaust louver 112 having the small holes as illustrated in FIG. 7 are adopted, a ventilation characteristic is impaired, which is disadvantageous in cooling of the power supply circuit board. In particular, when the cooling fan 113 is distant from the air intake louver 111 as illustrated in FIG. 7, the amount of air taken from the outside of the image forming apparatus 1100 into the image forming apparatus 1100 is reduced because of a low ventilation characteristic of the air intake louver 111. Thus, another cooling fan is required to be additionally provided or a large cooling fan is required to be provided, which may lead to increase in size of the image forming apparatus 1100.

SUMMARY OF THE INVENTION

In view of the foregoing, the present invention has an object to, when a varistor fails, prevent scattering of fragments of the varistor through an opening of an image forming apparatus to an outside without increasing a size of the image forming apparatus.

An image forming apparatus according to an embodiment of the present invention comprises:

a circuit board including a varistor, an electric part different from the varistor, and a heatsink for the electric part, the circuit board being supplied with a voltage from a commercial power source;

an image forming unit configured to form an image on a sheet, wherein the image forming unit is controlled by the voltage supplied to the circuit board;

a fan configured to cool the circuit board; and a housing configured to house the circuit board, wherein an opening is formed in the housing, wherein a cross-section shape of the heatsink is a U-shape, wherein the varistor is positioned between a first wall portion and a second wall portion of the heatsink so that the heatsink on the circuit board straddles the varistor on the circuit board, and wherein a position of the heatsink in a direction orthogonal to a longitudinal direction of the heatsink overlaps with a position of the opening in the direction so that an air is caused to flow between the first wall portion and the second wall portion through the opening by the fan.

Further features of the present invention will become apparent from the following description of exemplary embodiments with reference to the attached drawings.

BRIEF DESCRIPTION OF THE DRAWINGS

FIG. 4 is a sectional view of a power supply circuit board of a reference example, which is provided in the image forming apparatus.

FIG. 5A, FIG. 5B, and FIG. 5C are sectional views of a power supply circuit board according to the first embodiment, which is provided in the image forming apparatus.

FIG. 6A, FIG. 6B, and FIG. 6C are sectional views of a power supply circuit board according to the second embodiment, which is provided in the image forming apparatus.

DESCRIPTION OF THE EMBODIMENTS

Modes for carrying out the present invention are described below with reference to the accompanying drawings.

First Embodiment (Image Forming Apparatus)

Figure 1:
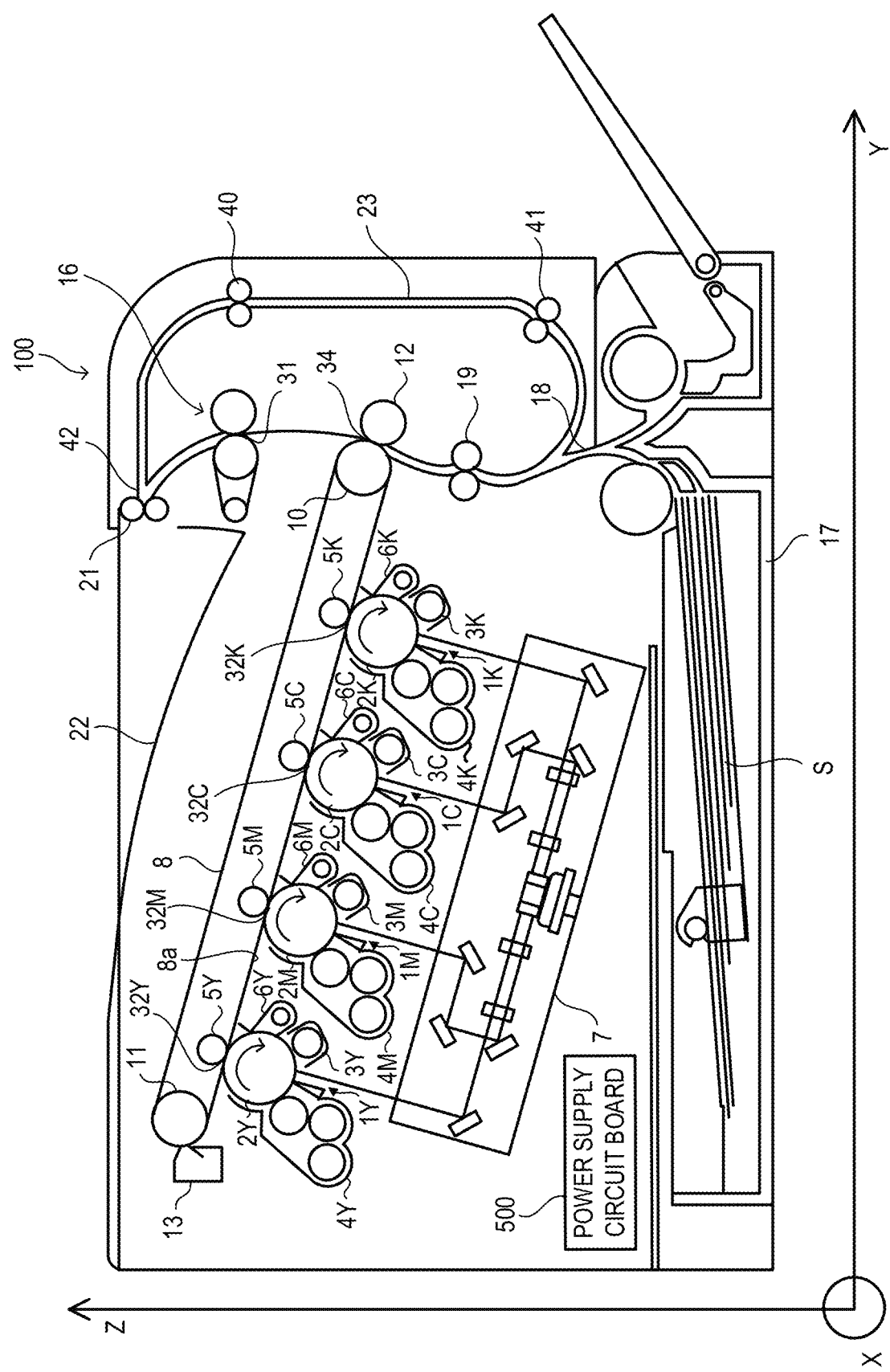
FIG. 1 is a sectional view of an image forming apparatus.

Now, the first embodiment is described for an image forming apparatus 100 as an example of electric equipment. The image forming apparatus 100 forms an image on a sheet S. FIG. 1 is a sectional view of the image forming apparatus 100. In the following description, a vertical direction from a lower side to an upper side of the image forming apparatus 100 is defined as a Z direction, a horizontal direction from a left side to a right side of the image forming apparatus 100 is defined as a Y direction, and a horizontal direction from a front side to a rear side of the image forming apparatus 100 is defined as an X direction. The image forming apparatus 100 is a full-color printer configured to form a color image on the sheet S with an electrophotographic method. However, the image forming apparatus 100 is not limited to the full-color printer, and may be, for example, an electrophotographic copying machine, a color LED printer, a multi-functional printer (MFP), a facsimile machine, or a printing machine. The image forming apparatus 100 is not limited to a color image forming apparatus configured to form a color image, and may also be a monochromatic image forming apparatus configured to form a monochromatic image. An image forming method is not limited to the electrophotographic method, and may also be, for example, an electrostatic recording method or an ink jet method. The image forming apparatus 100 includes four image forming portions (image forming units), that is, an image forming portion 1Y configured to form a yellow image, an image forming portion 1M configured to form a magenta image, an image forming portion 1C configured to form a cyan image, and an image forming portion 1K configured to form a black image. Those four image forming portions 1Y, 1M, 1C, and 1K are arranged in one row at constant distances from each other.

Drum-type electrophotographic photosensitive members (hereinafter referred to as "photosensitive drums") 2Y, 2M, 2C, and 2K serving as image bearing members are installed in the image forming portions 1Y, 1M, 1C, and 1K, respectively. Around the photosensitive drum 2Y, a primary charger 3Y, a developing device 4Y, a transfer roller 5Y serving as transfer unit, and a drum cleaner device 6Y are arranged. In the same manner, a primary charger 3M, a developing device 4M, a transfer roller 5M, and a drum cleaner device 6M are arranged around the photosensitive drum 2M, a primary charger 3C, a developing device 4C, a transfer roller 5C, and a drum cleaner device 6C are arranged around the photosensitive drum 2C, and a primary charger 3K, a developing device 4K, a transfer roller 5K, and a drum cleaner device 6K are arranged around the photosensitive drum 2K. A laser exposure device 7 is installed below the primary chargers 3Y, 3M, 3C, and 3K and the developing devices 4Y, 4M, 4C, and 4K.

A yellow toner, a magenta toner, a cyan toner, and a black toner are received in the developing devices 4Y, 4M, 4C, and 4K, respectively. Each of the photosensitive drums 2Y, 2M, 2C, and 2K is a negatively-charged organic photoconductive member (OPC photosensitive member) including an organic photoconductive layer formed on a drum base made of aluminum, and is rotated by a drive device (not shown) in a direction indicated by the arrow (clockwise direction in FIG. 1) at a predetermined process speed. The primary chargers 3Y, 3M, 3C, and 3K serving as primary charging units uniformly charge surfaces of the photosensitive drums 2Y, 2M, 2C, and 2K to a predetermined potential having negative polarity with a charging bias applied by a charging bias power source (not shown). The developing devices 4Y, 4M, 4C, and 4K cause the toners of the respective colors to adhere on electrostatic latent images formed on the photosensitive drums 2Y, 2M, 2C, and 2K to develop (visualize) the electrostatic latent images as toner images, respectively. Transfer rollers 5Y, 5M, 5C, and 5K serving as primary transfer units are arranged so as to be abuttable against the photosensitive drums 2Y, 2M, 2C, and 2K through an intermediate transfer belt 8 therebetween at primary transfer portions 32Y, 32M, 32C, and 32K, respectively. The drum cleaner devices 6Y, 6M, 6C, and 6K include, for example, cleaning blades for removing transfer residual toners remaining on the photosensitive drums 2 from the photosensitive drums 2 after primary transfer.

The intermediate transfer belt 8 is arranged on an upper surface side of the photosensitive drums 2Y, 2M, 2C, and 2K. The intermediate transfer belt 8 is provided in a tensioned manner between a secondary transfer opposed roller 10 and a tension roller 11. The secondary transfer opposed roller 10 is arranged on a secondary transfer portion 34 side, and is configured to apply a driving force to the intermediate transfer belt 8. The tension roller 11 is arranged on a side opposed to the secondary transfer opposed roller 10 through the primary transfer portions 32Y to 32K therebetween, and is configured to apply a tension to the intermediate transfer belt 8. The secondary transfer opposed roller 10 is arranged so as to be abuttable against a secondary transfer roller 12 through the intermediate transfer belt 8 therebetween at the secondary transfer portion 34. The intermediate transfer belt 8 is made of a dielectric resin such as polycarbonate, a polyethylene terephthalate resin film, or a polyvinylidene difluoride resin film. The intermediate transfer belt 8 is arranged so that a lower flat surface 8a serving as a primary transfer surface is inclined downward toward the secondary transfer portion 34 side. The lower flat surface 8a is arranged to be opposed to upper surfaces of the photosensitive drums 2Y, 2M, 2C, and 2K so as to be movable relative thereto, and is formed on a surface side opposed to the photosensitive drums 2.

The secondary transfer opposed roller 10 is arranged so as to be abuttable against the secondary transfer roller 12 through the intermediate transfer belt 8 therebetween at the secondary transfer portion 34. A belt cleaning device 13 configured to remove and collect a transfer residual toner remaining on a surface of the intermediate transfer belt 8 is installed on an outer side of the intermediate transfer belt 8 formed in an endless shape so as to be located in the vicinity of the tension roller 11. A fixing device 16 is arranged in a longitudinal path configuration on a downstream side of the secondary transfer portion 34 in a conveying direction for the sheet S. The laser exposure device 7 includes a laser light source, a polygon mirror, and a reflecting mirror. The laser light source is configured to emit light corresponding to a time-series electric digital image signal of image information provided thereto. The laser light exposure device 7 exposes the photosensitive drums 2Y, 2M, 2C, and 2K to light to form the electrostatic latent images of the respective colors on the surfaces of the photosensitive drums 2Y, 2M, 2C, and 2K charged with the primary chargers 3Y, 3M, 3C, and 3K, respectively, in accordance with the image information.

Next, image forming operations performed by the image forming apparatus 100 are described. When an image formation start signal is issued, the photosensitive drums 2Y, 2M. 2C, and 2K, which are rotated at a predetermined process speed, are uniformly charged to the negative polarity with the primary chargers 3Y, 3M, 3C, and 3K, respectively. Then, the laser exposure device 7 emits laser light from laser emitting elements in accordance with externally input color-separated image signals. The laser light passes through the polygon mirror and the reflecting mirror to form the electrostatic images of the respective colors on the photosensitive drums 2Y, 2M, 2C, and 2K, respectively.

Then, first, the yellow toner is caused to adhere to the electrostatic latent image formed on the photosensitive drum 2Y by the developing device 4Y to which a development bias of the same polarity as the charging polarity (negative polarity) for the photosensitive drum 2Y is applied, to thereby visualize the electrostatic latent image as a toner image. The yellow toner image is transferred onto the rotating intermediate transfer belt 8 by the transfer roller 5Y to which a primary transfer bias (of the polarity (positive polarity) opposite to the polarity of the toner) is applied, at the primary transfer portion 32Y between the photosensitive drum 2Y and the transfer roller 5Y.

The intermediate transfer belt 8, onto which the yellow toner image has been transferred, is moved to the image forming portion 1M. Then, in the image forming portion 1M as well, a magenta toner image formed on the photosensitive drum 2M is transferred in the same manner at the primary transfer portion 32M so as to be superimposed on the yellow toner image on the intermediate transfer belt 8. Subsequently, a cyan toner image formed on the photosensitive drum 2C in the image forming portion 1C and a black toner image formed on the photosensitive drum 2K in the image forming portion 1K are sequentially superimposed on the yellow toner image and the magenta toner image, which have been transferred onto the intermediate transfer belt 8 in a superimposed manner, at the primary transfer portion 32C and the primary transfer portion 32K, respectively. In this manner, a full-color toner image is formed on the intermediate transfer belt 8. At this time, the transfer residual toners remaining on the photosensitive drums 2Y, 2M, 2C, and 2K are scraped off and collected by the cleaner blades included in the drum cleaner devices 6Y, 6M, 6C, and 6K, respectively.

The sheet S is conveyed from a sheet feeding cassette 17 through a conveyance path 18 to registration rollers 19. The sheet S is conveyed by the registration rollers 19 to the secondary transfer portion 34 between the secondary transfer opposed roller 10 and the secondary transfer roller 12 so as to match the timing at which a leading edge of the full-color toner image on the intermediate transfer belt 8 is moved to the secondary transfer portion 34 between the secondary transfer opposed roller 10 and the secondary transfer roller 12. The full-color toner image on the intermediate transfer belt 8 is transferred at a time onto the sheet S, which has been conveyed to the secondary transfer portion 34, by the secondary transfer roller 12 to which a secondary transfer bias (of the polarity (positive polarity) opposite to the polarity of the toner) is applied.

After the sheet S on which the full-color toner image is formed is conveyed to the fixing device 16 and the full-color toner image is heated and pressurized to be thermally fixed onto a surface of the sheet S, the sheet S is discharged by delivery rollers 21 onto a delivery tray 22 on an upper surface of a main body. Then, a series of the image forming operations is terminated. A secondary transfer residual toner remaining on the intermediate transfer belt 8 is removed and collected by the belt cleaning device 13. The above-mentioned operations are the image forming operations at the time of simplex image formation.

Subsequently, double-sided image forming operations performed by the image forming apparatus 100 are described. The double-sided image forming operations are the same as the simplex image forming operations until the sheet S having one surface on which the image is formed is conveyed to the fixing device 16. After the full-color toner image is heated and pressurized so as to be thermally fixed onto the surface of the sheet S, the rotation of the delivery rollers 21 is stopped under a state in which most part of the sheet S is delivered by the delivery rollers 21 onto the delivery tray 22 on the upper surface of the main body. At this time, the sheet S is stopped so that a trailing edge of the sheet S reaches a reversal enabled position 42.

Subsequently, the delivery rollers 21 are reversely rotated in a rotating direction opposite to a normal rotating direction, to thereby convey the sheet S to a double-sided path 23 to which double-sided printing rollers 40 and 41 are provided. Through the reverse rotation of the delivery rollers 21, the sheet S is conveyed to the double-sided printing rollers 40 with the trailing edge of the sheet S, which is located at the reversal enabled position 42, now being conveyed as a leading edge. Thereafter, the sheet S is conveyed by the double-sided printing rollers 40 to the double-sided printing rollers 41. The sheet S is conveyed by the double-sided printing rollers 40 and 41 toward the registration rollers 19. Meanwhile, the image formation start signal is generated, and the leading edge of the full-color toner image on the intermediate transfer belt 8 is moved to the secondary transfer portion 34 between the secondary transfer opposed roller 10 and the secondary transfer roller 12 in the same manner as in the simplex image formation. The registration rollers 19 convey the sheet S to the secondary transfer portion 34 so as to match the timing at which the leading edge of the full-color toner image on the intermediate transfer belt 8 is moved to the secondary transfer portion 34. After the leading edge of the toner image and the leading edge of the sheet S are matched with each other at the secondary transfer portion 34, the toner image is transferred onto the sheet S. Then, the toner image is fixed onto the sheet S by the fixing device 16 in the same manner as in the simplex image forming operations. The sheet S having both surfaces on which the images are formed is delivered by the delivery rollers 21 onto the delivery tray 22. Then, a series of the double-sided image forming operations is terminated.

(Basic Control Portion)

Figure 2:
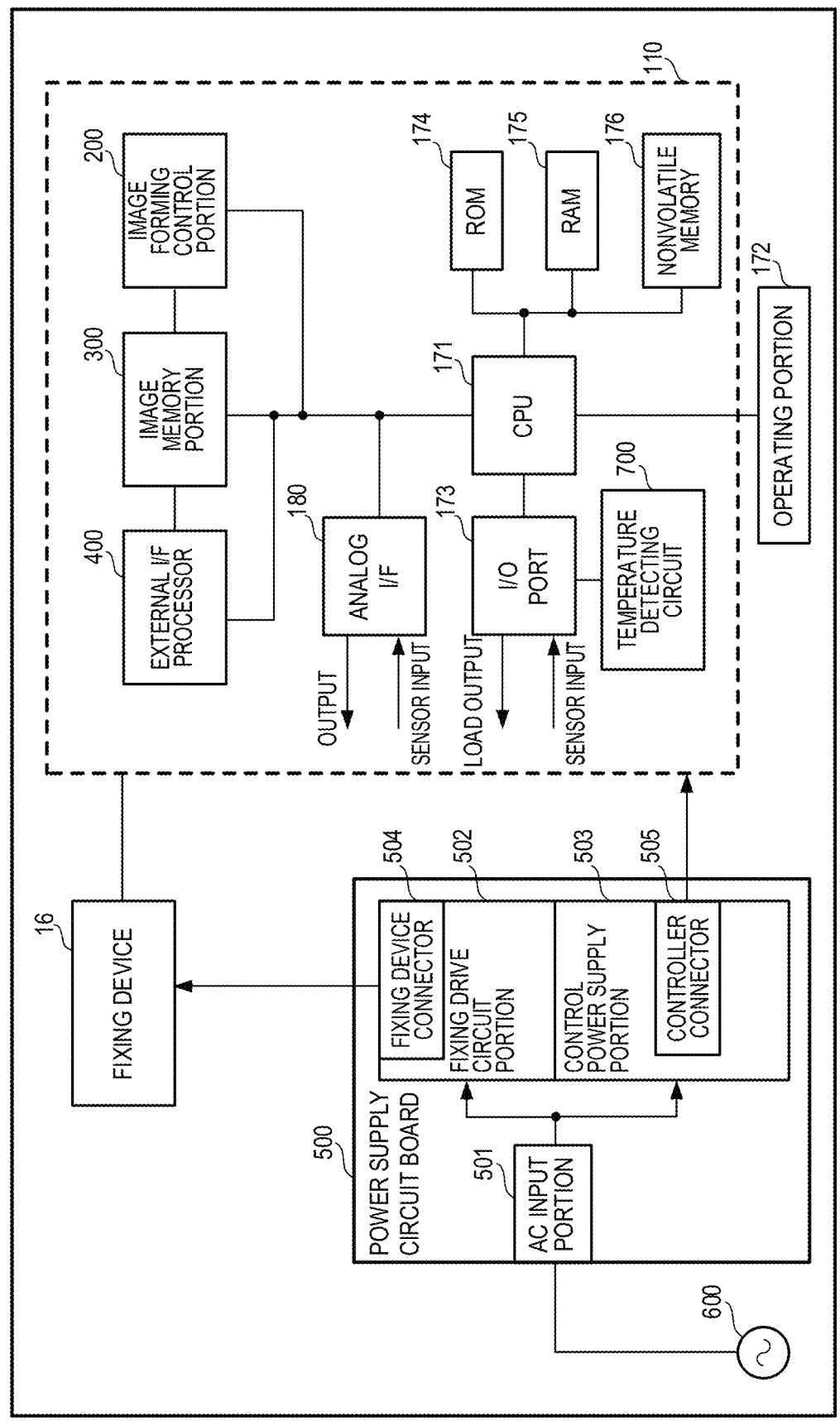
FIG. 2 is a block diagram of a control system of the image forming apparatus.

FIG. 2 is a block diagram of a control system of the image forming apparatus 100. A power supply circuit board 500 includes a fixing drive circuit portion 502 and a control power supply portion 503. The power supply circuit board 500 is connected to a commercial power source 600 through an AC input portion 501, which is a general connector. The AC input portion 501 is electrically connected to the fixing drive circuit portion 502 and the control power supply portion 503. The fixing drive circuit portion 502 is electrically connected to the fixing device 16 through a fixing device connector 504. The fixing drive circuit portion 502 includes a circuit configured to drive the fixing device 16, and is configured to mainly control AC power. The control power supply portion 503 is electrically connected to a basic control portion 110 through a controller connector 505. The control power supply portion 503 supplies control DC power at a relatively low voltage level (generally in a range of from 3.3 V to 5 V) to a CPU 171, an analog I/F 180, and a sensor (not shown) of the basic control portion 110 through the controller connector 505. The sensor is configured to detect a position of the sheet S. The control power supply portion 503 supplies load DC power (electric power) at a relatively high voltage level (generally 24 V) to a drive load (not shown) such as a motor or a clutch through the controller connector 505.

The image forming apparatus 100 includes the basic control portion 110 including the CPU 171. The CPU 171 is connected to a ROM 174, a RAM 175, a nonvolatile memory 176, an I/O port 173, and the analog I/F 180 through address buses and data buses. The ROM 174 stores a control program. The RAM 175 stores data necessary to perform control. The nonvolatile memory 176 can store data even after the power supply circuit board 500 of the image forming apparatus 100 is switched off. The I/O port 173 is connected to the drive loads (not shown) such as the motor and the clutch, the sensor (not shown) configured to detect the position of the sheet S, and the fixing device 16.

The CPU 171 sequentially controls inputs and outputs via the I/O port 173 in accordance with the control programs stored in the ROM 174 to execute the image forming operations. The CPU 171 is electrically connected to a console unit 172. The CPU 171 controls a display unit and a key input unit of the console unit 172. An operator can instruct the CPU 171 to switch an image forming operation mode and switch a display screen of the display unit through the key input unit. The CPU 171 causes the display unit to display a state of the image forming apparatus 100 and a value of the image forming operation mode set through the key input unit. The CPU 171 is electrically connected to an external I/F processing unit 400, an image memory unit 300, and an image forming controller 200. The external OF processing unit 400 transmits and receives image data and processing data between external equipment such as a PC and the CPU 171. The image memory unit 300 performs decompression processing for an image and temporary storage processing for the image data. The image forming controller 200 processes line image data transferred from the image memory unit 300. The image forming control portion 200 is electrically connected to the laser exposure device 7. The laser exposure device 7 exposes the photosensitive drums 2 to light in accordance with the image data processed by the image forming control portion 200.

(Varistor)

Figure 3A:
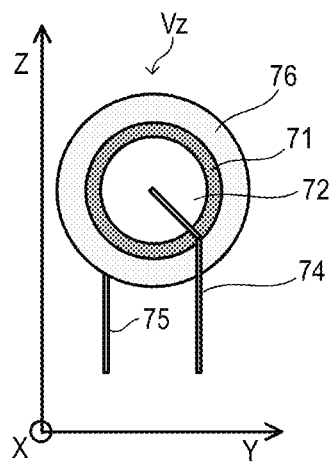
FIG. 3A, FIG. 3B, FIG. 3C, FIG. 3D, and FIG. 3E are explanatory views of a varistor.
Figure 3B:
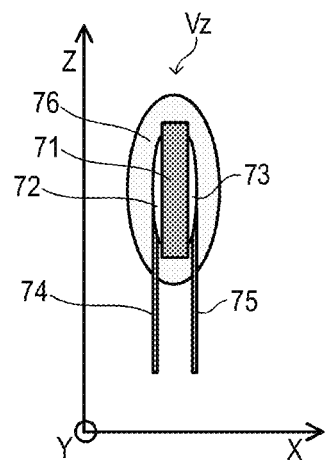

The power supply circuit board 500 includes a varistor Vz having a disc shape. The varistor Vz is an electric part having a surge absorption characteristic for protecting the power supply circuit board 500 and the basic controller 110 from an unexpected high voltage such as a lightning surge or an excessively high voltage surge. FIG. 3A, FIG. 3B, FIG. 3C, FIG. 3D, and FIG. 3E are explanatory views of the varistor Vz. FIG. 3A is a sectional view of the varistor Vz on a plane parallel to a YZ plane. FIG. 3B is a sectional view of the varistor Vz on a plane parallel to an XZ plane. The varistor Vz includes a semiconductor ceramic 71, electrodes 72 and 73, lead wires 74 and 75, and an exterior 76. The semiconductor ceramic 71 has a non-linear resistance characteristic. The two electrodes 72 and 73 are provided so as to sandwich the semiconductor ceramic 71 therebetween. The lead wires 74 and 75 are soldered to the two electrodes 72 and 73, respectively. The exterior 76 covers the semiconductor ceramic 71 and the electrodes 72 and 73. The varistor Vz has such a property that an electric resistance is high when a voltage between the two electrodes 72 and 73 is lower than a threshold voltage and the electric resistance is decreased when the voltage between the electrodes 72 and 73 is higher than the threshold voltage.

Figure 3C:
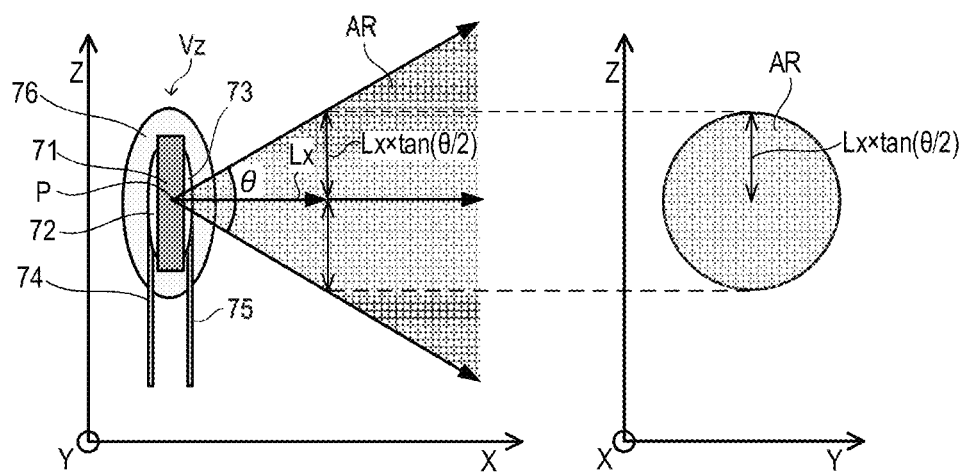
Figure 3D:
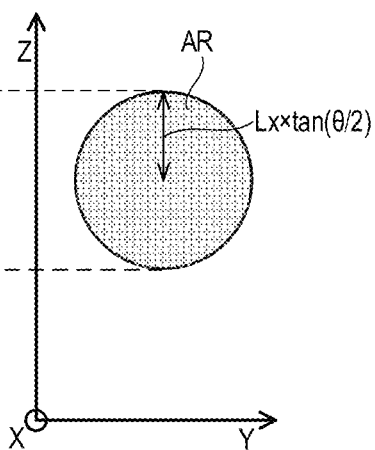
Figure 3E:
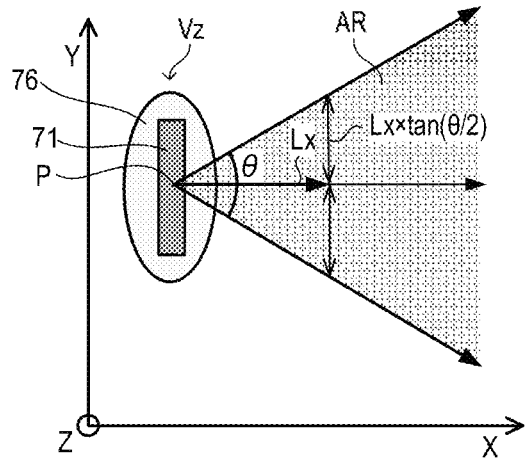
Figure 7:
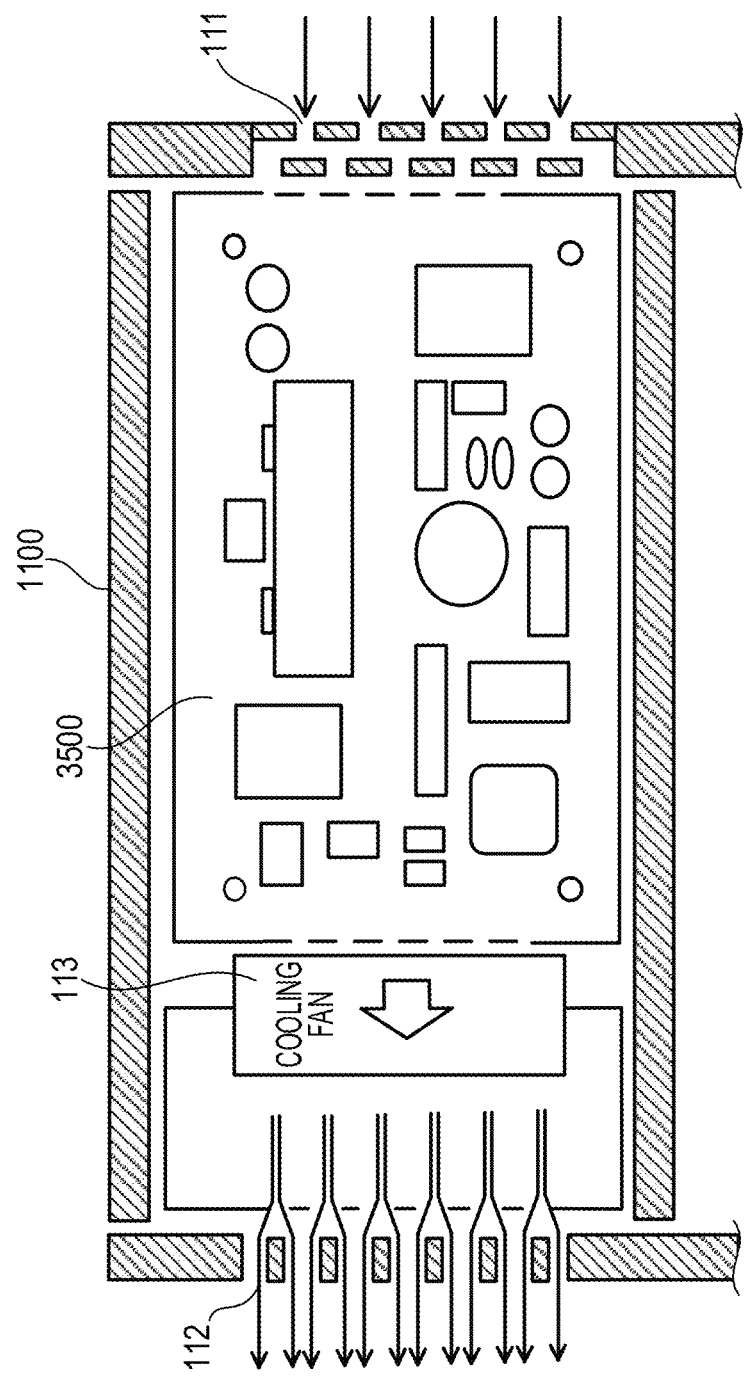
FIG. 7 is a sectional view of a related-art image forming apparatus configured to prevent scattering of fragments of the varistor.

When the varistor Vz fails, a part of the varistor Vz such as the semiconductor ceramic 71, the electrode 72 or 73, the lead wire (terminal) 74 or 75, or the exterior 76 may be scattered in some cases. FIG. 3C, FIG. 3D, and FIG. 3E are explanatory views for illustrating a direction of scattering of the part of the varistor Vz in case of failure accompanied by the scattering of the part and a range AR of scattering. FIG. 3C is a sectional view of the varistor Vz on the plane parallel to the XZ plane. FIG. 3D is a view for illustrating the range AR having a circular shape on the plane parallel to the YZ plane, which is taken at a distance Lx from the varistor Vz. FIG. 3E is a sectional view of the varistor Vz on the plane parallel to an XY plane. In the first embodiment, the varistor Vz is arranged so that surfaces of the electrodes 72 and 73, each having a circular shape, are arranged in parallel to the YZ plane, and the lead wires 74 and 75 extend in parallel to a Z-axis direction.

As described above, the varistor Vz may cause a failure accompanied by the scattering of the part in such rare cases that an abnormal voltage is repeatedly applied. On the XZ plane illustrated in FIG. 3C, it is experimentally known that fragments of the varistor Vz are scattered to fall within the range AR having an approximate center of the varistor Vz as a vertex P, a height in an X-axis direction orthogonal to the electrodes 72 and 73, each having the circular shape, and a solid angle θ. Even on the XY plane illustrated in FIG. 3E, it is experimentally known that fragments of the varistor Vz are scattered to fall within the range AR having the approximate center of the varistor Vz as the vertex P, the height in the X-axis direction orthogonal to the electrodes 72 and 73, each having the circular shape, and the solid angle A. Specifically, the fragments are scattered to fall within the range AR of a conical space, which has the approximate center of the varistor Vz as the vertex P, the height in the X-axis direction, and the solid angle A. Hence, for example, as illustrated in FIG. 3D, on the plane at the distance Lx from the varistor Vz, which is parallel to the YZ plane, the fragments are scattered to fall within the range AR of a circle having a radius of Lx×tan(θ/2).

(Power Supply Circuit Board of Reference Example)

Now, a power supply circuit board 1500 of a reference example is described with reference to FIG. 4. FIG. 4 is a sectional view of the power supply circuit board 1500 of the reference example included in the image forming apparatus 100. FIG. 4 is a sectional view on a plane parallel to the XY plane, which is for illustrating a positional relationship between mounted parts on part of the power supply circuit board 1500 of the reference example arranged on the left side of the laser exposure device 7 in the Y direction and a cooling fan 540 serving as a cooling part in the image forming apparatus 100 of FIG. 1.

The power supply circuit board 1500 is connected to the commercial power source 600 (FIG. 2) through the AC input portion 501, which is the general connector. A pattern P_H and a pattern P_N are formed on the power supply circuit board 1500. The pattern P_H is connected to a hot (H) terminal (live (L) terminal) of the commercial power source 600 through the AC input portion 501. The pattern P_N is connected to a neutral (N) terminal (cold terminal) of the commercial power source 600 through the AC input portion 501. The varistor Vz and a filter circuit 510 are electrically connected to the pattern P_H and the pattern P_N in the stated order from the AC input portion 501 toward a downstream side. Each of the pattern P_H and the pattern P_N branches on a downstream side of the filter circuit 510. One of the branches of each of the pattern P_H and the pattern P_N is connected to the control power supply portion 503, and is further electrically connected to the basic control portion 110 through the controller connector 505. Another one of the branches of each of the pattern P_H and the pattern P_N is connected to the fixing drive circuit portion 502, and is further electrically connected to the fixing device 16 through the fixing device connector 504.

The fixing drive circuit portion 502 includes gate-controlled semiconductor switches Q1 and Q2, which are used to control a temperature of the fixing device 16. The gate-controlled semiconductor switches Q1 and Q2 are frequently and repeatedly switched off and on so as to control a current supplied to the fixing device 16, and thus generate a large amount of heat due to a switching loss. Hence, heatsinks H1 and H2 for heat dissipation are arranged so as to be held in close contact with the gate-controlled semiconductor switches Q1 and Q2, respectively. In this manner, heat dissipation properties of the gate-controlled semiconductor switches Q1 and Q2 are improved by the heatsinks H1 and H2. As a result, an increase in temperature of the gate-controlled semiconductor switches Q1 and Q2 is suppressed. Each of the heatsinks H1 and H2 has a higher heat dissipation effect as a surface area thereof increases, and thus is a relatively large part.

Further, the gate-controlled semiconductor switches Q1 and Q2 are arranged in the vicinity of the cooling fan 540. When the gate-controlled semiconductor switches Q1 and Q2 are exposed to air from the cooling fan 540, the heat dissipation effect for the gate-controlled semiconductor switches Q1 and Q2 is enhanced. The cooling fan 540 is arranged on a rear side of the power supply circuit board 1500, and discharges heated air inside the image forming apparatus 100 to an outside of the image forming apparatus 100 through an opening portion 550 formed in an exterior (housing) 100a of the image forming apparatus 100. Through rotation of the cooling fan 540, outside air, which has been taken through an opening portion (not shown) formed in an exterior (not shown) on a rear side of the image forming apparatus 100, flows through the cooling fan 540, the power supply circuit board 1500, and the opening portion 550. Through the flow of the air, the power supply circuit board 1500 is cooled.

As described above, the opening portion 550 is generally formed as a cooling air path in the vicinity of the power supply circuit board 1500. Specifically, the opening portion 550 corresponding to the air path for allowing air to flow is arranged in the vicinity of the varistor Vz mounted on the power supply circuit board 1500 in many cases. When a failure of the varistor Vz, which is accompanied by the scattering of the part, occurs, the fragments are scattered within a range of the solid angle θ, which has the center of the varistor Vz as the vertex P, in a positive X-axis direction (predetermined direction) as illustrated in FIG. 3C, FIG. 3D, and FIG. 3E. The fragments of the varistor Vz are scattered in directions indicated by the arrows in FIG. 4. The range AR having the conical shape, in which the fragments of the varistor Vz may be scattered, intersects with the opening portion 550. Thus, there is a fear in that, depending on a size of the scattered fragment, the fragment may be scattered outside of the image forming apparatus 100 through the opening portion 550.

(Power Supply Circuit Board of First Embodiment)

To address the above-mentioned problem, the power supply circuit board 500 according to the first embodiment prevents scattering of the fragments of the varistor Vz through the opening portion 550 to the outside of the image forming apparatus 100. Now, the power supply circuit board 500 according to the first embodiment is described with reference to FIG. 5A, FIG. 5B, and FIG. 5C. FIG. 5A, FIG. 5B, and FIG. 5C are sectional views of the power supply circuit board 500 according to the first embodiment, which is provided in the image forming apparatus 100. The same configurations as those of the reference example, which are illustrated in FIG. 4, are denoted by the same reference symbols, and description thereof is omitted. Electrical connections in the power supply circuit board 500 according to the first embodiment are the same as those in the power supply circuit board 1500 of the reference example, which are illustrated in FIG. 4, and thus description thereof is omitted. The power supply circuit board 500 according to the first embodiment is different from the power supply circuit board 1500 of the reference example in arrangement of the gate-controlled semiconductor switches Q1 and Q2 and a heatsink H3. Differences are mainly described below.

FIG. 5A is a sectional view of the power supply circuit board 500 on a plane parallel to the XY plane, which is for illustrating a positional relationship between part of mounted parts on the power supply circuit board 500 according to the first embodiment and the cooling fan 540 corresponding to the cooling part. FIG. 5B is a sectional view of the power supply circuit board 500, which is taken along the line VB-VB of FIG. 5A. FIG. 5C is a sectional view of the power supply circuit board 500 on a plane parallel to the YZ plane. In FIG. 5C, the power supply circuit board 500 is not illustrated in a positive Y-axis direction corresponding to a length direction. The opening portion 550 is formed in the exterior 100a so as to pass in a direction parallel to the surfaces of the electrodes 72 and 73 of the varistor Vz.

As illustrated in FIG. 5A, FIG. 5B, and FIG. 5C, the heatsink H3 is arranged so as to cover the varistor Vz. The heatsink H3 covers the varistor Vz so that the range AR having the conical shape, in which the fragments of the varistor Vz may be scattered, does not intersect the opening portion 550. The heatsink H3 has two side walls H3a and H3b and a top wall H3c. The two side walls H3a and H3b are parallel to the YZ plane. The top wall H3c connects the two side walls H3a and H3b. The heatsink H3 has an elongated shape extending in a Y-axis direction as a whole. The heatsink H3 has a downwardly open U-shape in cross section parallel to the XZ plane. The cross section of the heatsink H3 taken along a direction orthogonal to a longitudinal direction is a U-shape. The gate-controlled semiconductor switches Q1 and Q2 are arranged so as to be held in close contact with the side wall H3b of the heatsink H3. The side wall H3a as at least a part of the heatsink H3 is located between the varistor Vz and the opening portion 550.

A positional relationship between the heatsink H3 and the varistor Vz is now described. Coordinates of the center of the varistor Vz on the X axis, the Y axis, and the Z axis are represented as Lx_vz, Ly_vz, and Lz_vz. A distance between the side wall H3a of the heatsink H3 and the center of the varistor Vz is represented as Lx_h1. A distance between the side wall H3b of the heatsink H3 and the center of the varistor Vz is represented as Lx_h2. A coordinate of a front-side end of the heatsink H3 in the Y-axis direction (upper end of the heatsink H3 on the Y coordinate) is represented as Ly_h1t, and a coordinate of a rear-side end of the heatsink H3 in the Y-axis direction (lower end of the heatsink H3 on the Y coordinate) is represented as Ly_h1b. A coordinate of an upper-side end of the heatsink H3 in the Z-axis direction (upper end of the heatsink H3 on the Z coordinate) is represented as Lz_h1t, and a coordinate of a lower-side end of the heatsink H3 in the Z-axis direction (lower end of the heatsink H3 on the Z coordinate) is represented as Lz_h1b.

For example, for a size of the side wall H3$a$ of the heatsink H3, which is to be selected, the Y-axis coordinate Ly_vz and the Z-axis coordinate Lz_vz of the center of the varistor Vz, and the distance Lx_h1 between the side wall H3$a$ and the center of the varistor Vz are set so as to satisfy the following relational expressions.

$$Ly\_vz + Lx\_h1 \times \tan(\theta/2) < Ly\_h1t$$

$$Ly\_vz - Lx\_h1 \times \tan(\theta/2) > Ly\_h1b$$

$$Lz\_vz + Lx\_h1 \times \tan(\theta/2) < Lz\_h1t$$

$$Lz\_vz - Lx\_h1 \times \tan(\theta/2) > Lz\_h1b$$

When the above-mentioned relational expressions are satisfied, the side wall H3$a$ of the heatsink H3 can cover a whole surface of a base, which is defined at the height Lx_h1, of the range AR, which has the conical shape with the solid angle $\theta$, in which the fragments of the varistor Vz may be scattered.

Further, for a size of the side wall H3$b$ of the heatsink H3, which is to be selected, the Y-axis coordinate Ly_vz and the Z-axis coordinate Lz_vz of the center of the varistor Vz, and the distance Lx_h2 between the side wall H3$b$ and the center of the varistor Vz are set so as to satisfy the following relational expressions.

$$Ly\_vz + Lx\_h2 \times \tan(\theta/2) < Ly\_h1t$$

$$Ly\_vz - Lx\_h2 \times \tan(\theta/2) > Ly\_h1b$$

$$Lz\_vz + Lx\_h2 \times \tan(\theta/2) < Lz\_h1t$$

$$Lz\_vz - Lx\_h2 \times \tan(\theta/2) > Lz\_h1b$$

When the above-mentioned relationships are satisfied, the side wall H3$b$ of the heat sink H3 can cover a whole surface of a base, which is defined at the height Lx_h2, of the range AR, which has the conical shape with the solid angle $\theta$, in which the fragments of the varistor Vz may be scattered. The solid angle $\theta$ at which the fragments of the varistor Vz may be scattered differs depending on a withstand voltage or a manufacturer, and is experimentally up to about 120 degrees. It is preferred that the predetermined solid angle $\theta$ be set to 120 degrees or smaller.

An example of the positional relationship between the varistor Vz and the heatsink H3 is expressed as follows.

$$Lx\_h1 = 5 \text{ mm}$$

$$\theta = 120°$$

In a case of the above-mentioned example, Lx_h1$\times\tan(\theta/2) \approx 8.66$ is established.

The above-mentioned expression is modified as follows.

$$Ly\_vz > Ly\_h1b + 8.66 \text{ mm}$$

$$Lz\_vz > Lz\_h1b + 8.66 \text{ mm}$$

In the first embodiment, the coordinates are set as follows.

$$Ly\_vz = Ly\_h1b + 10 \text{ mm}$$

$$Lz\_vz = Lz\_h1b + 12.5 \text{ mm}$$

In the first embodiment, a size of the heatsink H3, which satisfies the above-mentioned expressions, is set as follows so as to prevent the scattering of the fragments of the varistor Vz.

$$Ly\_h1t - Ly\_h1b = 20 \text{ mm}$$

$$Lz\_h1t - Lz\_h1b = 25 \text{ mm}$$

In the first embodiment, the whole surface of the base of the range AR having the conical shape with the solid angle A (whole area having the solid angle A), in which the fragments of the varistor Vz may be scattered in the positive X-axis direction, is covered with the heatsink H3. However, when the varistor Vz is arranged so that the range AR having the conical shape, in which the fragments of the varistor Vz may be scattered, does not intersect the opening portion 550, the whole surface of the base of the range AR having the conical shape is not always required to be covered with the heatsink H3. The heatsink H3 is only required to cover a part of the range AR having the conical shape, which intersects the opening portion 550. However, there is also a fear of scattering of the fragments of the varistor Vz through an extremely small gap (opening portion), which may be unintentionally formed at a joining portion between the exterior 100$a$ of the image forming apparatus 100 and another exterior. In consideration of the fear described above, it is desired that the heatsink H3 cover the whole area having the solid angle $\theta$ to limit the range AR in which the fragments of the varistor Vz may be scattered, as in the first embodiment.

In the power supply circuit board 500 in the first embodiment, the position of the heatsink H3 in the direction orthogonal to the longitudinal direction of the heatsink H3 overlaps with the position of the opening portion 550 in the direction. This aims to cause the air to flow between the side wall H3$a$ and the side wall H3$b$ by the cooling fan 540 through the opening portion 550, to thereby facilitate heat dissipation.

According to the first embodiment, when the varistor Vz fails, the scattering of fragments of the varistor Vz to the outside through the opening portion 550 of the image forming apparatus 100 can be prevented without increasing a size of the image forming apparatus 100. Further, a surface area of the heatsink H3 is not restricted. Thus, a heat dissipation effect of the heatsink H3 for the gate-controlled semiconductor switches Q1 and Q2 can be maintained.

Second Embodiment

Now, the second embodiment is described with reference to FIG. 6A, FIG. 6B, and FIG. 6C. In the second embodiment, the same structures as those of the first embodiment are denoted by the same reference symbols, and description thereof is herein omitted. The image forming apparatus according to the second embodiment is the same as that of the first embodiment, and hence description thereof is omitted.

(Power Supply Circuit Board of Second Embodiment)

Now, a power supply circuit board 2500 according to the second embodiment is described with reference to FIG. 6A, FIG. 6B, and FIG. 6C. FIG. 6A, FIG. 6B, and FIG. 6C are sectional views of the power supply circuit board 2500 according to the second embodiment, which is provided in the image forming apparatus 100. The same configurations as those of the reference example, which are illustrated in FIG. 4, are denoted by the same reference symbols, and description thereof is omitted. Electrical connections in the power supply circuit board 2500 according to the second embodiment are the same as those in the power supply circuit board 1500 of the reference example, which are illustrated in FIG. 4, and thus description thereof is omitted. The power supply circuit board 2500 according to the second embodiment is different from the power supply circuit board 500 of the first embodiment in arrangement of the gate-controlled semiconductor switches Q1 and Q2 and heatsinks H4 and H5. Differences are mainly described below.

FIG. 6A is a sectional view of the power supply circuit board 2500 on a plane parallel to the XY plane, which is for illustrating a positional relationship between part of mounted parts on the power supply circuit board 2500 according to the second embodiment and the cooling fan 540 corresponding to the cooling part. FIG. 6B is a sectional view of the power supply circuit board 2500, which is taken along the line VIB-VIB of FIG. 6A. FIG. 6C is a sectional view of the power supply circuit board 2500 on a plane parallel to the YZ plane. In FIG. 6C, the power supply circuit board 2500 is not illustrated in a positive Y-axis direction corresponding to a length direction. The opening portion 550 is formed in the exterior 100a so as to pass in a direction parallel to the surfaces of the electrodes 72 and 73 of the varistor Vz.

As illustrated in FIG. 6A, FIG. 6B, and FIG. 6C, the two heatsinks H4 and H5 are provided on the power supply circuit board 2500. Each of the heatsinks H4 and H5 has a rectangular shape parallel to the YZ plane, and has an elongated shape extending in the Y-axis direction. The heatsinks H4 and H5 are arranged so as to be held in close contact with the gate-controlled semiconductor switches Q1 and Q2, respectively. The heatsinks H4 and H5 are arranged so as to cover the varistor Vz. The heatsink H4 covers the whole area of the range AR having the conical shape so that the range AR having the conical shape, in which the fragments of the varistor Vz may be scattered, does not intersect the opening portion 550. The heatsink H4 as at least a part of the two heatsinks H4 and H5 is arranged between the varistor Vz and the opening portion 550.

A positional relationship between the heatsink H4 and the varistor Vz is now described. Coordinates of the center of the varistor Vz on the X axis, the Y axis, and the Z axis are represented as Lx_vz, Ly_vz, and Lz_vz, as in the first embodiment described with reference to FIG. 5A, FIG. 5B, and FIG. 5C. A distance between the heatsink H4 and the center of the varistor Vz is represented as Lx_h4. A coordinate of a front-side end of the heatsink H4 in the Y-axis direction (upper end of the heatsink H4 on the Y coordinate) is represented as Ly_h4t, and a coordinate of a rear-side end of the heatsink H4 in the Y-axis direction (lower end of the heatsink H4 on the Y coordinate) is represented as Ly_h4b. A coordinate of an upper-side end of the heatsink H4 in the Z-axis direction (upper end of the heatsink H4 on the Z coordinate) is represented as Lz_h4t, and a coordinate of a lower-side end of the heatsink H4 in the Z-axis direction (lower end of the heatsink H4 on the Z coordinate) is represented as Lz_h4b.

For example, for a size of the heatsink H4, which is to be selected, the Y-axis coordinate Ly_vz and the Z-axis coordinate Lz_vz of the center of the varistor Vz, and the distance Lx_h4 between the heat sink H4 and the center of the varistor Vz are set so as to satisfy the following relational expressions.

$Ly\_vz+Lx\_h4 \times \tan(\theta/2) < Ly\_h4t$ $Ly\_vz-Lx\_h4 \times \tan(\theta/2) > Ly\_h4b$ $Lz\_vz+Lx\_h4 \times \tan(\theta/2) < Lz\_h4t$ $Lz\_vz-Lx\_h4 \times \tan(\theta/2) > Lz\_h4b$ When the above-mentioned relational expressions are satisfied, the heatsink H4 can cover a whole surface of a base, which is defined at the height Lx_h4, of the range AR, which has the conical shape with the solid angle θ, in which the fragments of the varistor Vz may be scattered.

Now, a positional relationship between the heatsink H5 and the varistor Vz is described. A distance between the heatsink H5 and the center of the varistor Vz is represented as Lx_h5. A coordinate of a front-side end of the heatsink H5 in the Y-axis direction (upper end of the heatsink H5 on the Y coordinate) is represented as Ly_h5t, and a coordinate of a rear-side end of the heatsink H5 in the Y-axis direction (lower end of the heatsink H5 on the Y coordinate) is represented as Ly_h5b. In the second embodiment, the coordinates Ly_h5t and Ly_h5b of the heatsink H5 are set to the same coordinates as the coordinates Ly_h4t and Ly_h4b of the heatsink H4. However, the coordinates Ly_h5t and Ly_h5b may be set to be different from the coordinates Ly_h4t and Ly_h4b. A coordinate of an upper-side end of the heatsink H5 in the Z-axis direction (upper end of the heatsink H5 on the Z coordinate) is represented as Lz_h5t, and a coordinate of a lower-side end of the heatsink H5 in the Z-axis direction (lower end of the heatsink H5 on the Z coordinate) is represented as Lz_h5b. In the second embodiment, the coordinates Lz_h5t and Lz_h5b of the heatsink H5 are set to the same coordinates as the coordinates Lz_h4t and Lz_h4b of the heatsink H4. However, the coordinates Lz_h5t and Lz_h5b may be set to be different from the coordinates Lz_h4t and Lz_h4b.

For example, for a size of the heatsink H5, which is to be selected, the Y-axis coordinate Ly_vz and the Z-axis coordinate Lz_vz of the center of the varistor Vz, and the distance Lx_h5 between the heat sink H5 and the center of the varistor Vz are set so as to satisfy the following relational expressions.

$Ly\_vz+Lx\_h5 \times \tan(\theta/2) < Ly\_h5t$ $Ly\_vz-Lx\_h5 \times \tan(\theta/2) > Ly\_h5b$ $Lz\_vz+Lx\_h5 \times \tan(\theta/2) < Lz\_h5t$ $Lz\_vz-Lx\_h5 \times \tan(\theta/2) > Lz\_h5b$ When the above-mentioned relationships are satisfied, the heat sinks H4 and H5 can cover a whole area of a base range AR having the conical shape with the solid angle θ, which is defined at the height Lx_h4 or the height Lx_h5, in which the fragments of the varistor Vz may be scattered. In this manner, the scattering of the fragments of the varistor Vz through the opening portion 550 formed in the exterior 100a of the image forming apparatus 100 or an extremely small gap (opening portion), which may be unintentionally formed at a joining portion between the exterior 100a of the image forming apparatus 100 and another exterior, can be prevented.

In the first and second embodiments, the heatsinks H3, H4, and H5 for heat dissipation for the gate-controlled semiconductor switches Q1 and Q2 are used as parts configured to cover the whole area having the solid angle θ, in which the fragments of the varistor Vz may be scattered. However, the heatsinks H3, H4, and H5 are merely examples. The same effects can be obtained even when a heatsink for heat dissipation for another part is used.

According to the second embodiment, when the varistor Vz fails, the scattering of fragments of the varistor Vz to the outside through the opening portion 550 of the image forming apparatus 100 can be prevented without increasing a size of the image forming apparatus 100.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-133394, filed Jul. 19, 2019, which is hereby incorporated by reference herein in its entirety.

What is claimed is:

1. An image forming apparatus, comprising:
an image forming unit configured to form an image;
a transfer unit configured to transfer the image onto a sheet;
a fixing unit configured to heat the image on the sheet to fix the image to the sheet;
a circuit board configured to supply electric current from a commercial power source to the fixing unit;
a fan configured to cool the circuit board;
a switching element provided on the circuit board and configured to control the electric current supplied to the fixing unit;
a heatsink including a first wall portion and a second wall portion with which the switching element is in contact; and
a varistor provided on the circuit board and configured to protect the circuit board from a high voltage,
wherein an opening is formed in an exterior housing of the image forming apparatus,
wherein a cross-section shape of the heatsink is a U-shape,
wherein the varistor includes a first plate electrode, a second plate electrode, and a non-linear resistance element provided between the first plate electrode and the second plate electrode, and
wherein the varistor is located, on the circuit board, between the first wall portion and the second wall portion of the heatsink so that the first plate electrode and the second plate electrode face the first wall portion and the second wall portion of the heatsink, respectively.

2. The image forming apparatus according to claim 1, wherein the switching element is in contact with a first side of the second wall portion, and
wherein the varistor is located on a second side opposite to the first side of the second wall portion.

3. The image forming apparatus according to claim 1, further comprising another switching element provided on the circuit board and configured to control the electric current supplied to the fixing unit,
wherein the another switching element is in contact with the second wall portion.

4. The image forming apparatus according to claim 1, wherein the circuit board further includes an electric part different from the varistor,
wherein the electric part is mounted on a surface, on which the varistor is mounted, of the circuit board, and
wherein the electric part is mounted out of an area between the first wall portion and the second wall portion in the circuit board.

5. An image forming apparatus, comprising:
an image forming unit configured to form an image;
a transfer unit configured to transfer the image onto a sheet;
a fixing unit configured to heat the image on the sheet to fix the image to the sheet;
a circuit board configured to supply electric current from a commercial power source to the fixing unit;
a fan configured to cool the circuit board;
an opening formed in an exterior of the image forming apparatus;
a switching element provided on the circuit board and configured to control the electric current supplied to the fixing unit;
a heatsink which is in contact with the switching element; and
a varistor provided on the circuit board and configured to protect the circuit board from a high voltage,
wherein the varistor includes a first plate electrode, a second plate electrode, and a non-linear resistance element provided between the first plate electrode and the second plate electrode,
wherein the varistor is broken by the high voltage and scatters fragments of the varistor,
wherein the heatsink is disposed in a position in which the heatsink intersects a virtual line which extends in a direction in which the fragments are scattered and toward the opening, and
wherein the first plate electrode of the varistor faces the heatsink.

6. The image forming apparatus according to claim 5, wherein the heatsink includes a first side facing the first plate electrode and a second side contacting the switching element.

7. The image forming apparatus according to claim 5, further comprising:
another switching element provided on the circuit board and configured to control the electric current supplied to the fixing unit; and
another heatsink contacting the another switching element,
wherein the second plate electrode of the varistor faces the another heatsink, and
wherein the varistor is located between the heatsink and the another heatsink.

8. The image forming apparatus according to claim 5, further comprising:
another switching element provided on the circuit board and configured to control the electric current supplied to the fixing unit; and
another heatsink contacting the another switching element,
wherein the second plate electrode of the varistor faces the another heatsink,
wherein the varistor is located between the heatsink and the another heatsink, and
wherein the circuit board includes an electric part mounted out of an area between the heatsink and the another heatsink.

9. The image forming apparatus according to claim 5, wherein the heatsink is located between the fan and the opening.

\* \* \* \* \*